(12) United States Patent
Miyazawa et al.

(10) Patent No.: US 7,339,386 B2
(45) Date of Patent: Mar. 4, 2008

(54) PROBE, PRINTED CIRCUIT BOARD TESTING DEVICE AND PRINTED CIRCUIT BOARD TESTING METHOD

(75) Inventors: Susumu Miyazawa, Mishima (JP); Mikio Hara, Tagata-gun (JP); Syuji Kagiyama, Mishima (JP); Yasuo Mori, Sunto-gun (JP); Kyosuke Yoshizu, Numazu (JP); Shigenori Makita, Numazu (JP); Yoshino Miyazawa, Numazu (JP)

(73) Assignee: Fujitsu Limited, Kawasaki (JP)

( * ) Notice: Subject to any disclaimer, the term of this patent is extended or adjusted under 35 U.S.C. 154(b) by 146 days.

(21) Appl. No.: 11/289,452

(22) Filed: Nov. 30, 2005

(65) Prior Publication Data

US 2006/0076968 A1    Apr. 13, 2006

(51) Int. Cl.
*G01R 31/02* (2006.01)
(52) U.S. Cl. ...................................................... 324/754

(58) Field of Classification Search ..................... None
See application file for complete search history.

(56) References Cited

U.S. PATENT DOCUMENTS 6,275,054 B1 * 8/2001 Boyle ......................... 324/754
6,525,553 B1 * 2/2003 Reynoso et al. ............ 324/755

* cited by examiner

*Primary Examiner*—Ha Tran Nguyen
*Assistant Examiner*—Trung Q. Nguyen
(74) *Attorney, Agent, or Firm*—Staas & Halsey LLP

(57) ABSTRACT

A probe is mountable to a printed circuit board testing device which performs a test on a predetermined land and/or a predetermined via hole of a printed circuit board. The probe includes a probe tip and a protrusion. The probe tip is contactable with the land and/or the via hole and projectable from the probe. The protrusion is disposed at a surface of the probe, the surface of the probe being disposed opposite to where the probe tip is projectable. The protrusion is grounded by a reaction pressure that is generated when the probe tip contacts the land and/or the via hole.

8 Claims, 11 Drawing Sheets

| No | ADDRESS | | NET PROPERTY | POWER SUPPLY PROPERTY |
|---|---|---|---|---|
| | X | Y | | |
| 1 | x1 | y1 | net1 | |
| 2 | x1 | y2 | net1 | |
| 3 | x1 | y3 | net2 | |
| 4 | x1 | y4 | net3 | |
| 5 | x1 | y5 | net3 | |
| 6 | x1 | y6 | | Vcc |
| 7 | x1 | y7 | | Vcc |
| . | . | . | | |
| . | . | . | | |
| 10 | x2 | y1 | net2 | |
| 11 | x2 | y2 | net3 | |
| 12 | x2 | y3 | net4 | |
| 13 | x2 | y4 | net4 | |
| 14 | x2 | y6 | | GND |
| 15 | x2 | y7 | | GND |
| . | . | . | | |
| . | . | . | | |

PRINTED BOARD

X – Y ROBOT

PROBE TIP

0 V CLAMPING OUT OF DEVICE

PROBE, PRINTED CIRCUIT BOARD TESTING DEVICE AND PRINTED CIRCUIT BOARD TESTING METHOD

BACKGROUND OF THE INVENTION

1. Field of the Invention

The present invention relates to a testing device for testing a digital information processor, and, more particularly, to a testing device which performs testing by causing a simulated failure to occur at a printed circuit board in an operation state.

2. Description of the Related Art

Hitherto, parallel scanning and serial scanning have been available as methods of testing a digital information processor. In each of these methods, as shown in each of the respective examples illustrated in FIGS. 6 and 7, a circuit designed exclusively for testing is added to a printed circuit board 600, 700, the state of flip-flop (FF) 601, 602, 701, 702 in a digital circuit is arbitrarily set while monitoring an output, and a failure is detected when an output corresponding to the set state cannot be obtained. AND circuit 603 is included in parallel scanning.

Figure 6:
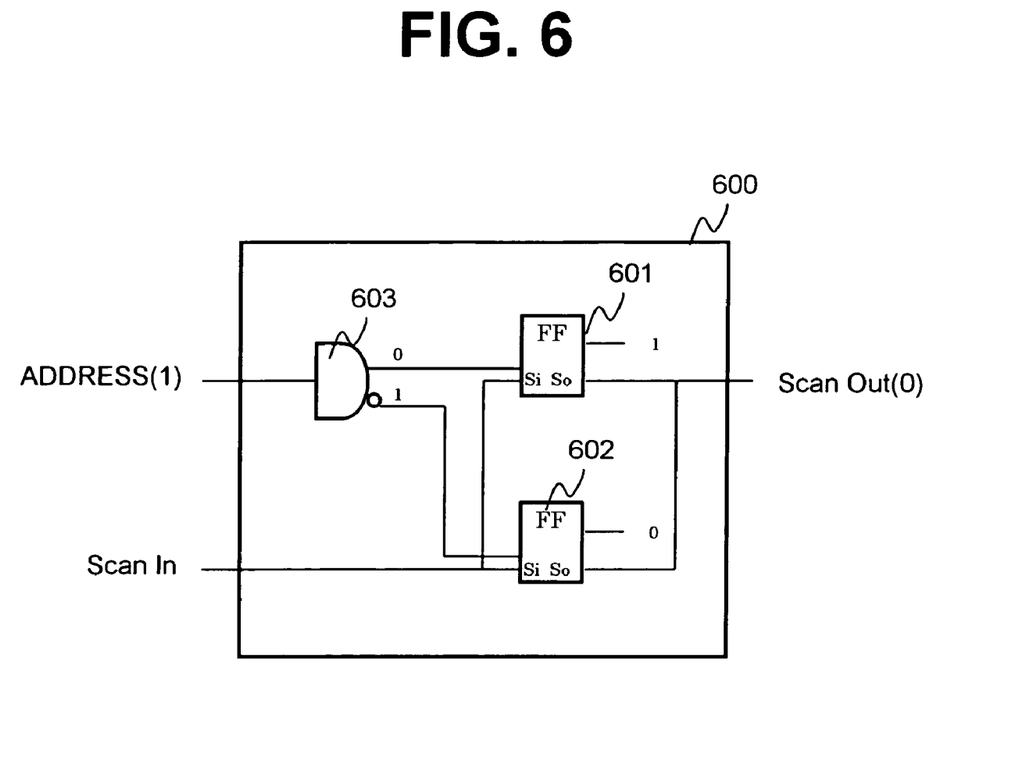
FIG. 6 shows an example of a circuit for parallel scanning.
Figure 7:
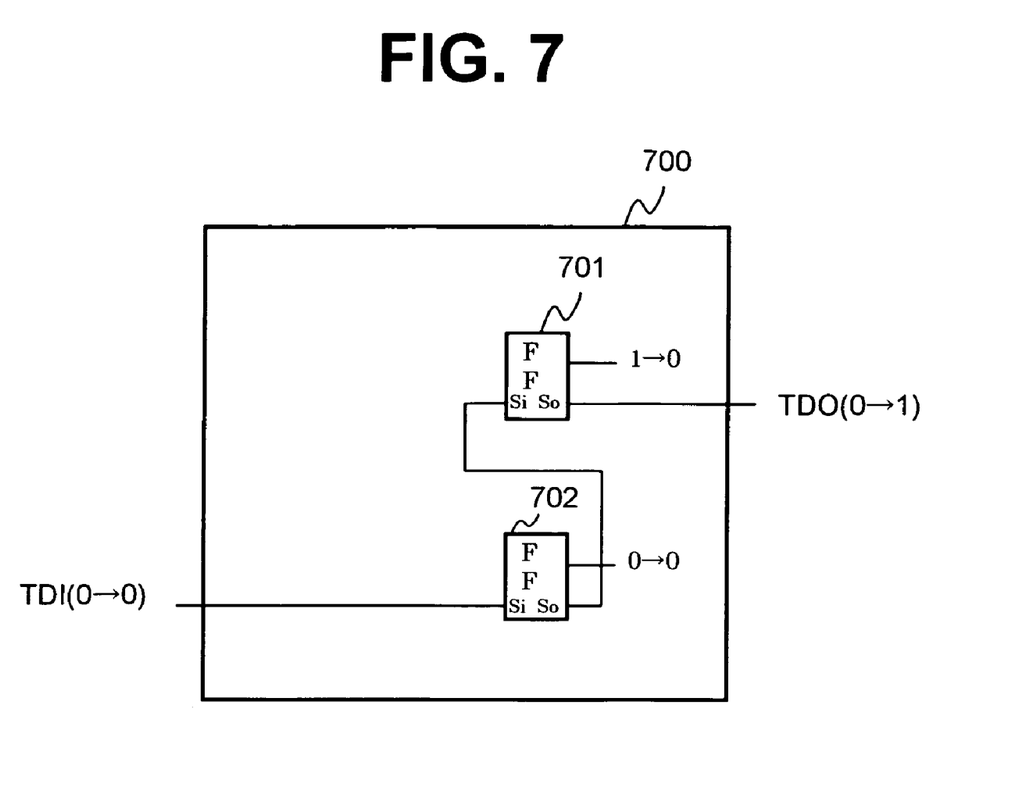
FIG. 7 shows an example of a circuit for serial scanning.

However, in these methods, as the size of the digital circuit is increased, the proportion occupied by the added circuit designed exclusively for testing in comparison with the size of the actual digital circuit is increased to a proportion that cannot be ignored. In addition, in the serial scanning method, in order to set each FF 601, 602, 701, 702 state, the device must be stopped once.

A testing method which uses an X-Y robot and which monitors a signal level at any point on a printed circuit board is disclosed (refer to Japanese Unexamined Patent Application Publication No. 11-94907 (hereafter "Patent Document")).

Figure 8:
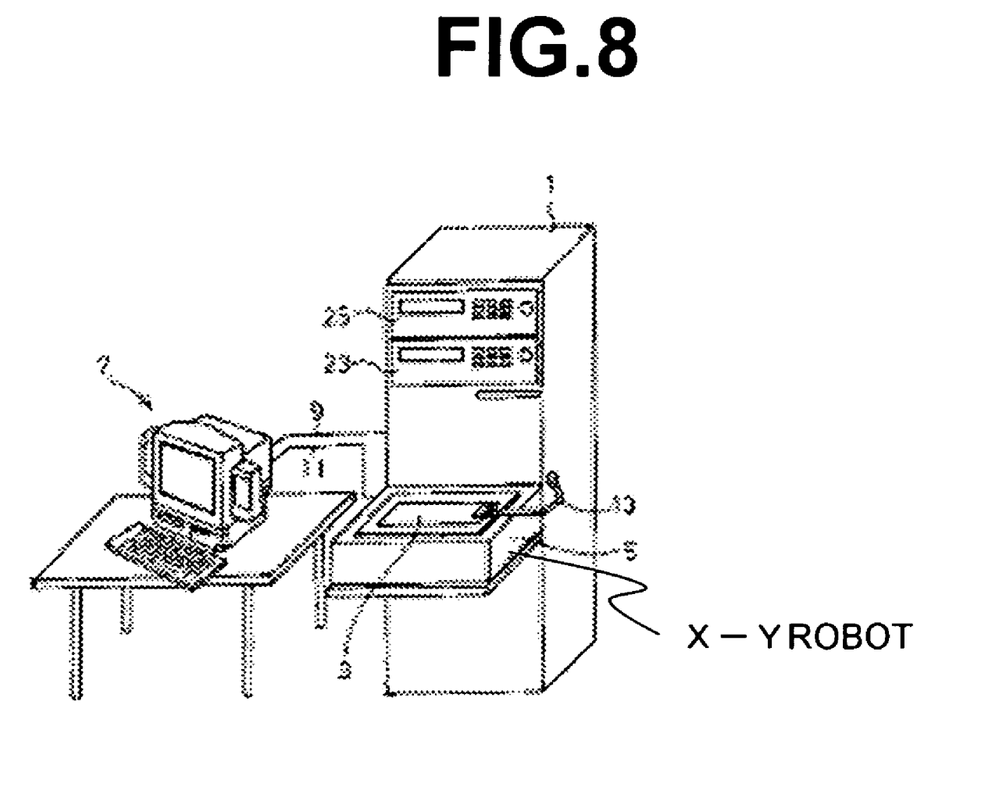
FIG. 8 shows an example of a testing structure using an X-Y robot.

In the method described in Patent Document, as shown in FIG. 8, an X-Y robot which holds a printed circuit board of a device to be tested is used, a probe tip of a probe is moved in accordance with a movement command from a personal computer and is brought into contact with a via hole and/or a land to be tested, the output from the probe is monitored, and the output is compared with a predetermined signal level in order to determine whether the device to be tested is in a normal state or an abnormal state.

Figure 9:
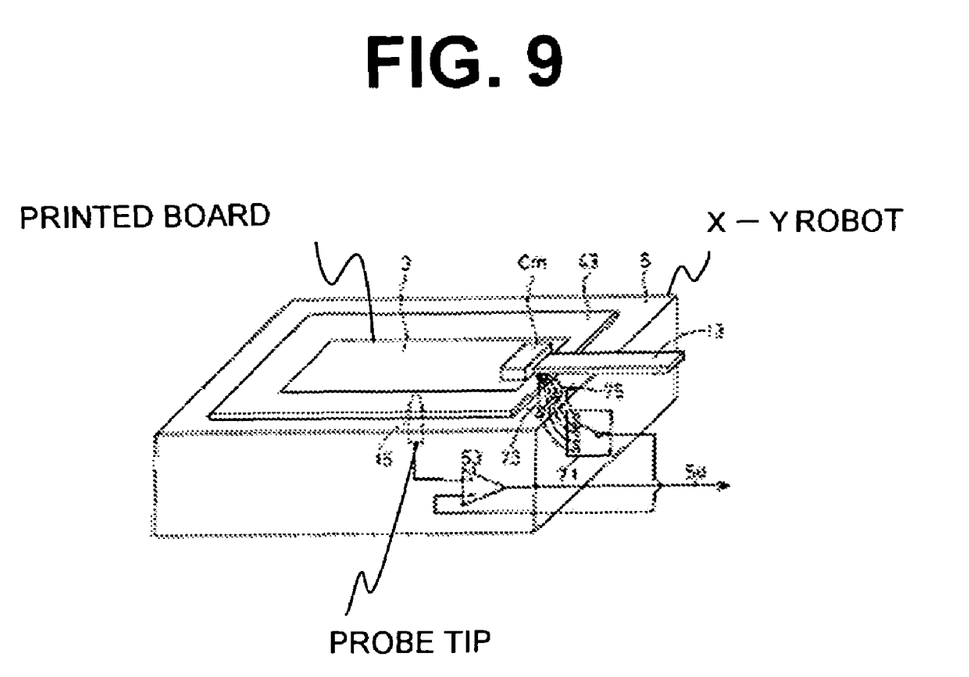
FIG. 9 shows in detail the example of the testing structure using the X-Y robot.

FIG. 9 shows in detail the X-Y robot in the testing structure shown in FIG. 8. The method illustrated in FIG. 9 is a method of drawing out a printed circuit board to be tested onto the testing X-Y robot, and allows dc operation testing. In a high-speed digital processor, when the printed circuit board is drawn out to a testing support table, testing cannot be carried out in a proper operation state because of the effects of a clock delay or a signal waveform disturbance. In the method disclosed in Patent Document, the signal level at each point on the printed circuit board is only monitored. Therefore, an error detection circuit testing which, in a normal state, has difficulty determining an operation state cannot be carried out.

Figure 10:
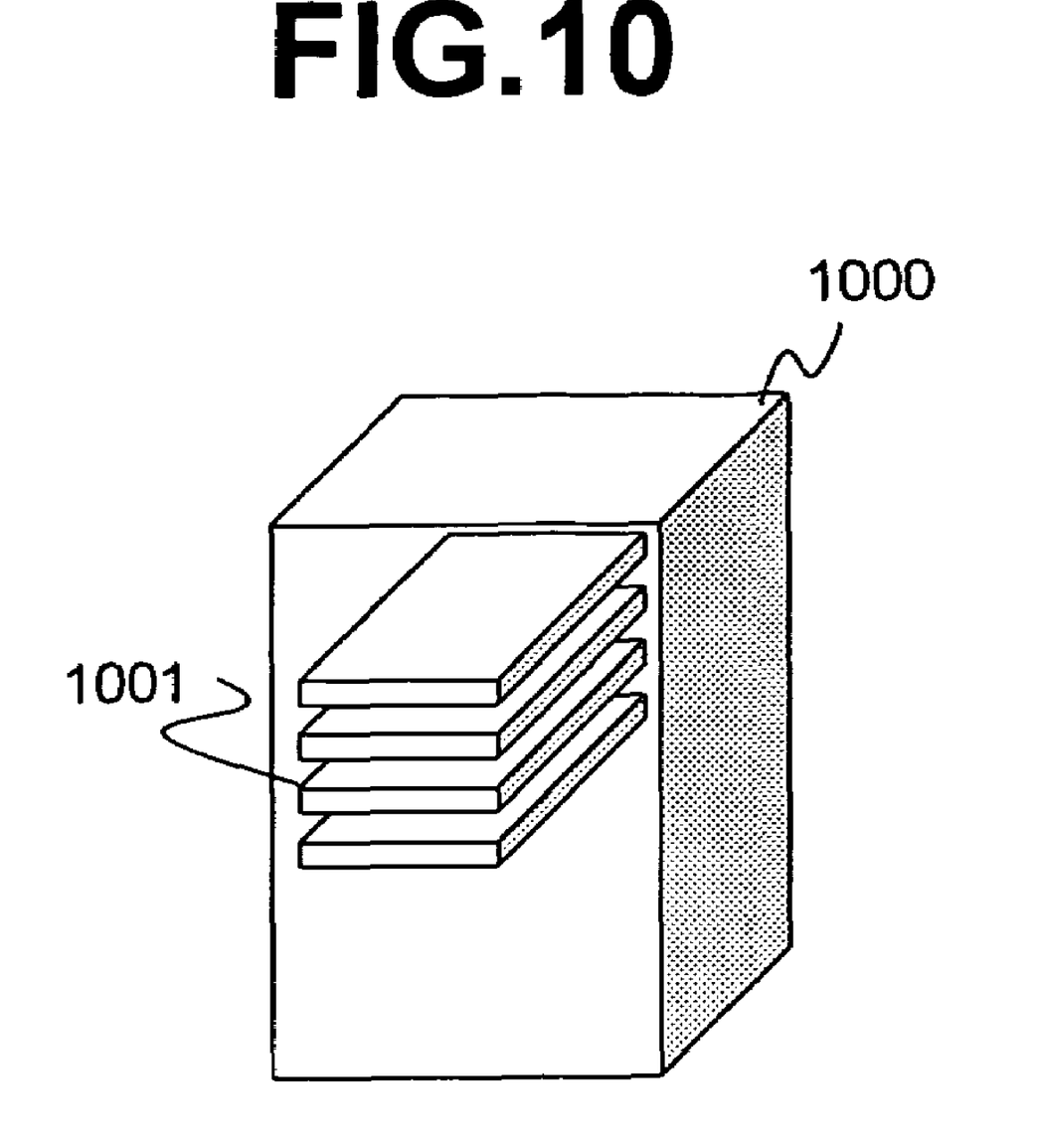
FIG. 10 shows a general mounted state of a device.
Figure 11:
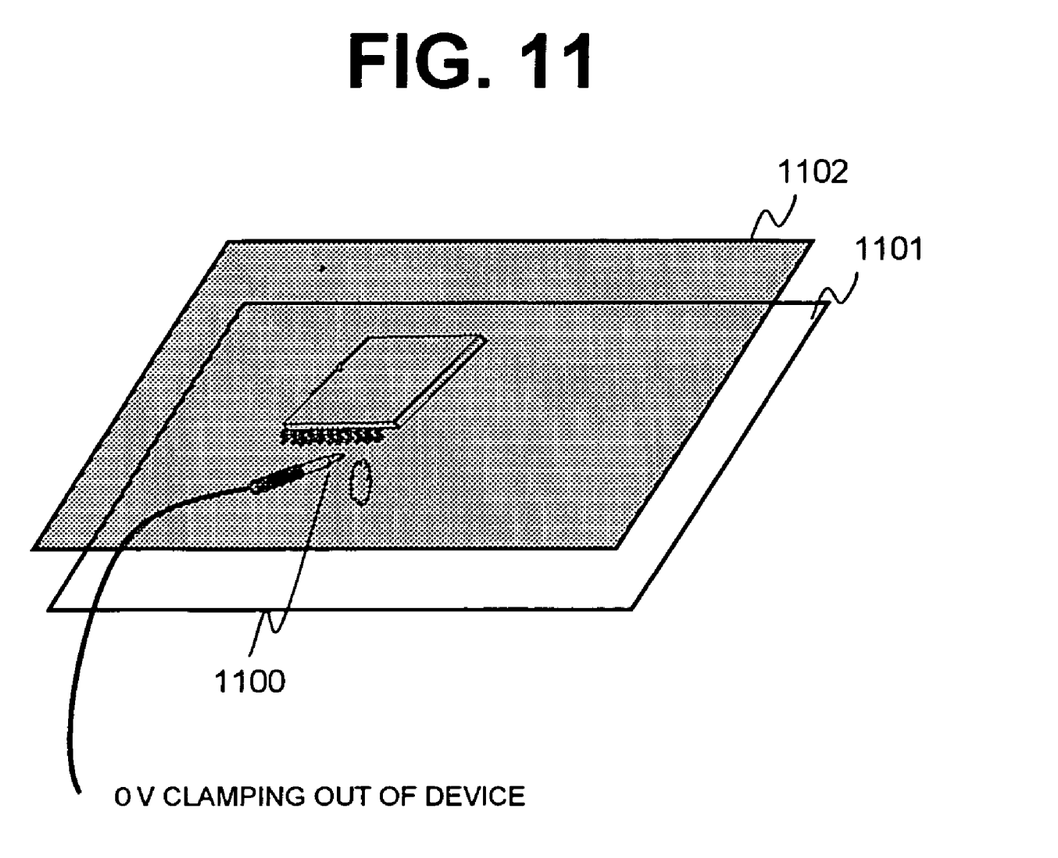
FIG. 11 shows an example of bringing a probe into contact in the mounted state of the device.

A method of causing a simulated failure to occur by bringing a predetermined point on a printed circuit board into contact with a probe connected to, for example, 0 volts and forcefully performing a 0 volt clamping is available. However, as shown in FIG. 10, since, in general, in an actual information processor 1000, a plurality of printed circuit boards 1001 are disposed in parallel and mounted, in order to bring the probe into contact with each point of a digital circuit while the printed circuit boards 1001 are mounted, it is necessary to insert the probe 1100 having a long lead wire into a gap between the printed circuit boards 1101, 1102 as shown in FIG. 11. However, with the probe 1100 having a long lead wire, a reliable 0 volt clamping cannot be expected in high-speed operation.

SUMMARY OF THE INVENTION

Accordingly, it is an object of the present invention to make it possible to carry out testing by reliably causing a simulated failure to occur at a printed circuit board of a digital information processor in an operation state.

To this end, according to a first aspect of the present invention, there is provided a probe mountable to a printed circuit board testing device which performs a test on a predetermined land and/or a predetermined via hole of a printed circuit board. The probe comprises a probe tip and a protrusion. The probe tip is contactable with the land and/or the via hole and projectable from the probe. The protrusion is disposed at a surface of the probe, the surface of the probe being disposed opposite to where the probe tip is projectable. The protrusion is grounded by a reaction pressure that is generated when the probe tip contacts the land and/or the via hole.

In a first form based on the first aspect, an electrically conductive guide panel is provided with respect to the surface of the probe where the protrusion is provided, and the protrusion is grounded to the guide panel by the reaction pressure that is generated when the probe tip contacts the land and/or the via hole.

In a second form based on the first aspect, a guide panel is mounted to a surface of the printed circuit board facing the surface of the probe where the protrusion is provided, and the protrusion is grounded to the guide panel by the reaction pressure that is generated when the probe tip contacts the land and/or the via hole.

In a third form based on the first form, the probe is disposed in a gap between the printed circuit board to be tested and a printed circuit board adjacent thereto.

In a fourth form based on the first aspect, the probe tip has a spring structure and is incorporated in the probe so as to be projectable from a surface of the probe.

In a fifth form based on the first aspect, the probe further comprises a collision sensor for detecting a collision of the probe.

According to a second aspect of the present invention, there is provided a printed circuit board testing device which performs a test on a predetermined land and/or a predetermined via hole of a printed circuit board. The testing device comprises a probe for performing the test on the land and/or the via hole, inputting means for inputting positional information of the land and/or the via hole, and positioning means for determining the position of the probe in accordance with the positional information. When a probe tip of the probe is projected and comes into contact with the land and/or the via hole, a protrusion at the probe is grounded by a reaction pressure that is generated when the probe tip contacts the land and/or the via hole.

In a first form based on the second aspect, an electrically conductive guide panel is provided with respect to a surface of the probe where the protrusion is provided, and the protrusion is grounded to the guide panel by the reaction pressure that is generated when the probe tip contacts the land and/or the via hole.

In a second form based on the second aspect, the probe tip of the probe has a spring structure and is incorporated in the probe so as to be projectable from a surface of the probe.

In a third form based on the first form, the probe is disposed in a gap between the printed circuit board to be tested and a printed circuit board adjacent thereto.

According to a third aspect of the present invention, there is provided a printed circuit board testing method of performing a test on a predetermined land and/or a predetermined via hole of a printed circuit board. The method comprises the steps of inputting positional information of the land and/or the via hole, positioning a probe for determining the position of the probe, which performs the test on the land and/or the via hole, in accordance with the positional information, projecting a probe tip of the probe, and grounding a protrusion at the probe by a reaction pressure that is generated when the probe tip that has been projected in the probe tip projecting step contacts the land and/or the via hole.

In a first form based on the third aspect, an electrically conductive guide panel is disposed with respect to a surface of the probe where the protrusion is disposed, and the grounding step comprises grounding the protrusion to the guide panel by the reaction pressure that is generated when the probe tip contacts the land and/or the via hole.

In a second form based on the third aspect, the probe tip projecting step comprises projecting from a surface of the probe the probe tip which has a spring structure and which is incorporated in the probe.

In a third form based on the first form, the positioning step comprises determining the position of the probe by inserting the probe into a gap between the printed circuit board to be tested and a printed circuit board adjacent thereto.

The present invention makes it possible to cause a simulated failure to occur by grounding any via hole and/or land of a printed circuit board of a digital information processor in an operation state, so that a failure state can also be tested.

DESCRIPTION OF THE PREFERRED EMBODIMENT

In an embodiment, a probe 4 has a probe tip 61 which is brought into contact with a via hole and/or a land in order for the probe 4 to perform a testing operation.

Figure 1:
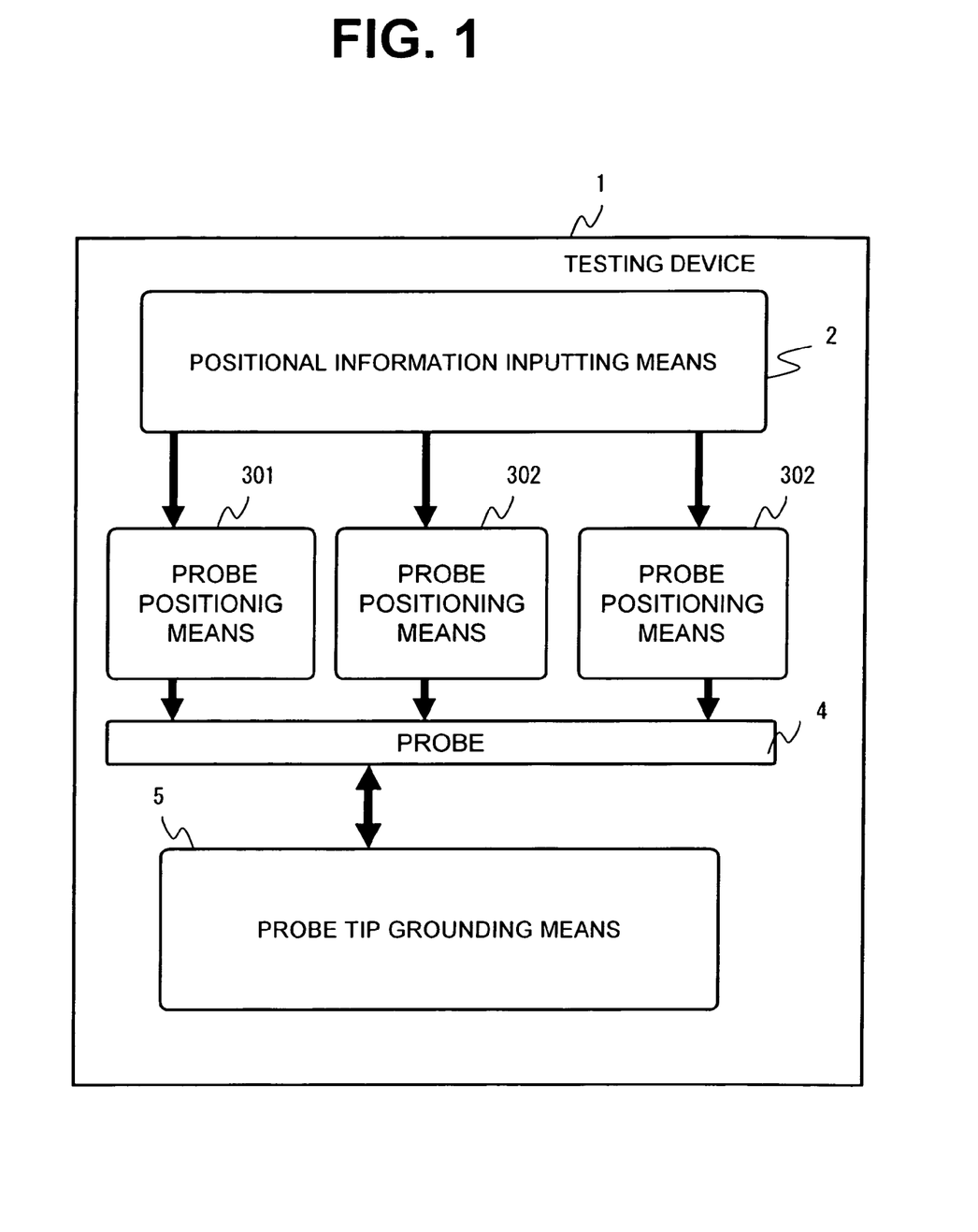
FIG. 1 shows a basic structure of a testing device according to the present invention.

FIG. 1 shows a basic structure of a testing device 1 according to the present invention. Positional information of a via hole and/or a land of a printed circuit board to be tested is input to a positional information inputting means 2 from a testing server in FIG. 2. When probe positioning means 301, 302, 303 positions the probe 4 in accordance with the positional information and probe tip grounding means 5 brings the electrically conductive probe tip into contact with the predetermined via hole and/or land after the position of the probe 4 has been determined, a top-like portion, disposed at a surface of the probe situated opposite to where the probe tip is projectable, is grounded by a reaction pressure generated when the probe tip contacts the land and/or the via hole. Here, a protrusion in the claims corresponds to the top-like portion. the positional information inputting means 2 is such as a circuit of receiving positional information from the testing server 3 and input positional information to probe positioning means 301, 302, 303. Probe positioning means 301, 302, 303 are such as motors to control the probe 4, and probe tip grounding means 5 is also such as a circuit of grounding.

[Practical Form]

Figure 2:
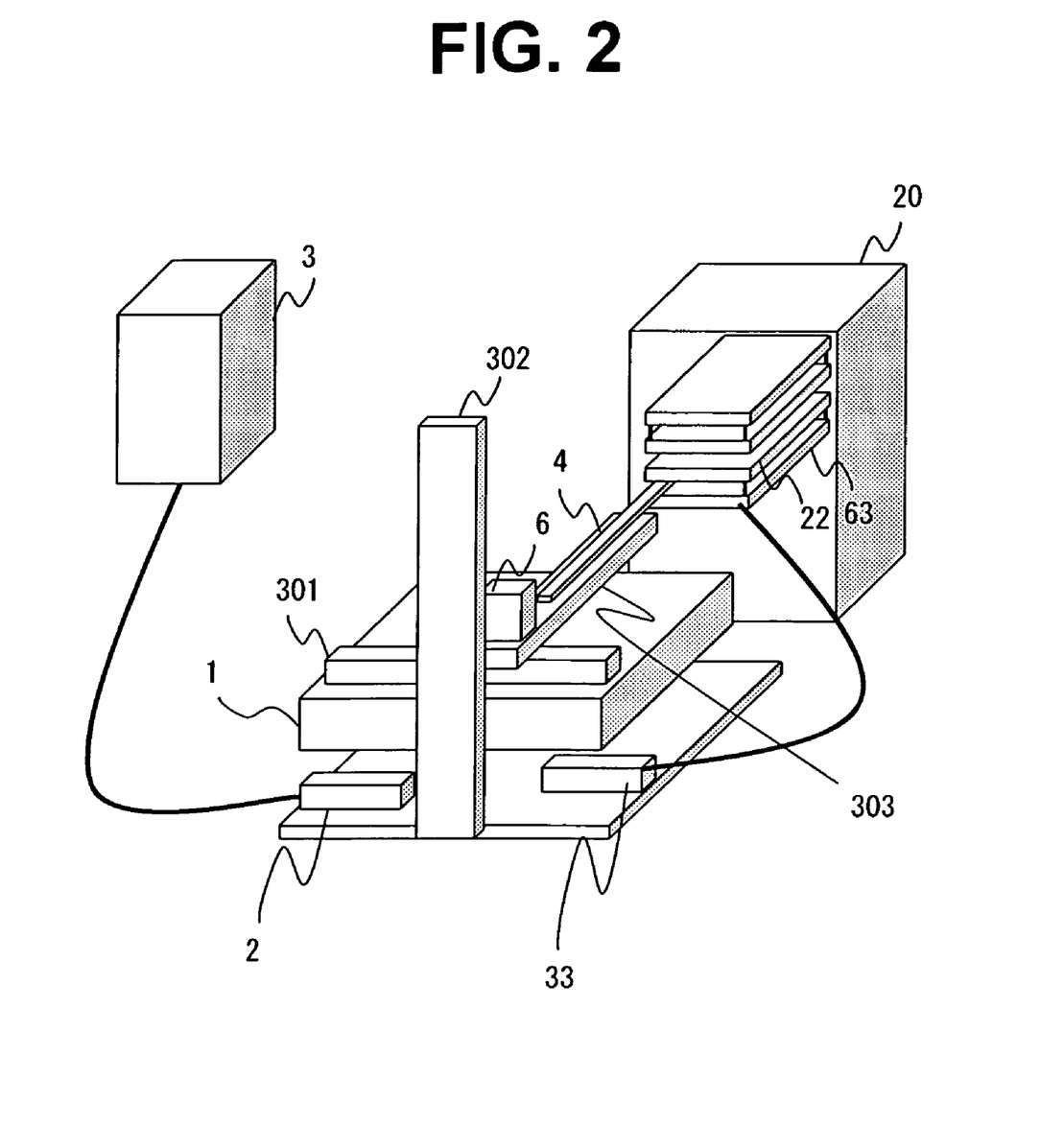
FIG. 2 shows an example of a structure of a testing system according to the present invention.
Figure 3:
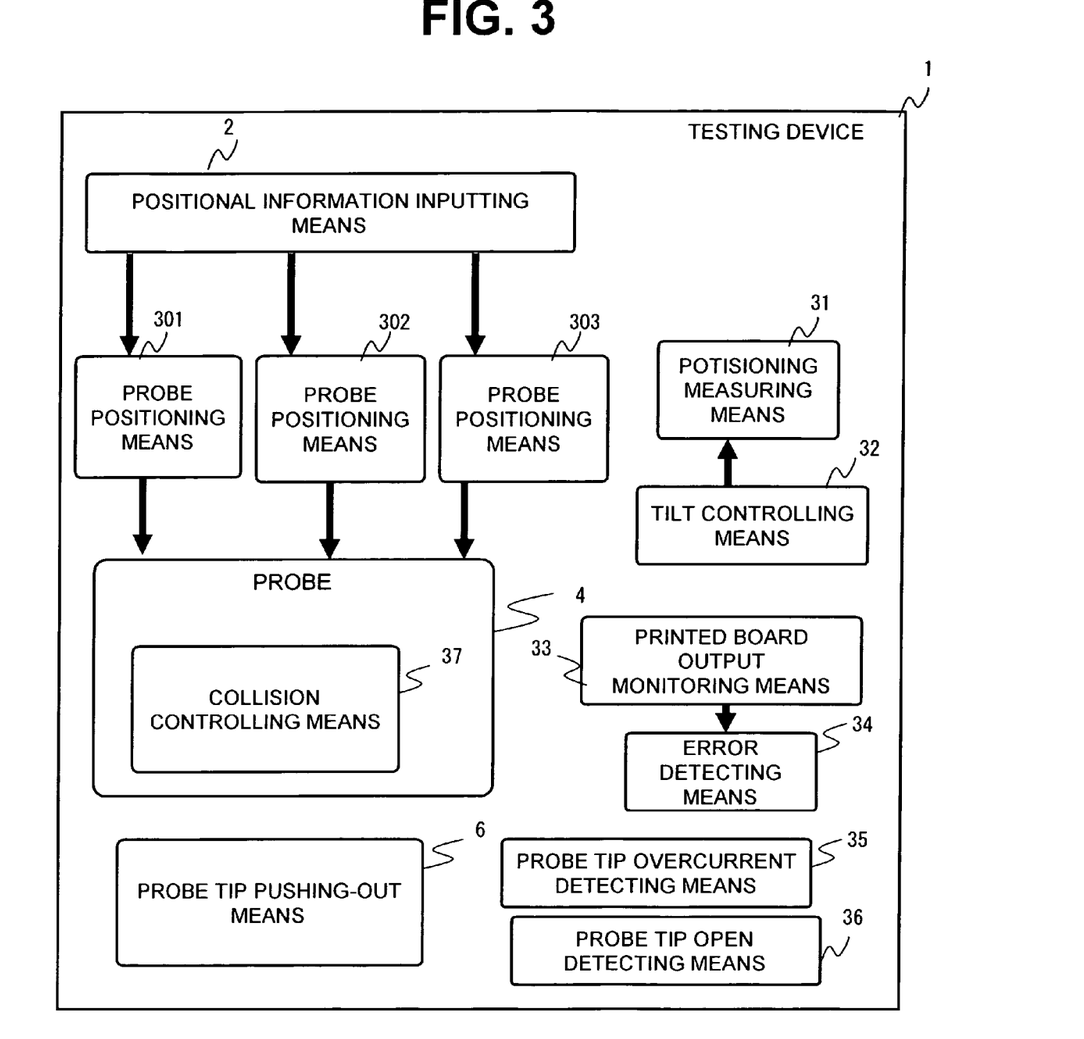
FIG. 3 shows a block structural view of a practical form.

FIG. 2 shows a device 20 to be tested including printed circuit boards 22 to be tested and an example of a testing system using the testing device 1 according to the present invention. FIG. 3 shows a functional block view of the testing device 1 in the testing system. Testing device 1 has also a controller (not illustrated in FIG. 3), which controls their functional means in FIG. 3

The device 20 to be tested is previously set so as to be in a predetermined positional relationship with the testing device 1.

Alternatively, the testing device 1 comprises positioning measuring means 31 and tilt controlling means 32. The positioning measuring means 31 measures the position of the printed circuit board 22 or the device 20, and the tilt controlling means 32 stores a reference position of the printed circuit board 22 or the device 20 and corrects the positional information on the basis of the position measured by the position measuring means 31 and the reference position.

Printed circuit board output monitoring means 33 is electrically connected with a guide panel 63 and monitors the output of the printed circuit board 22 to be tested and outputs the monitored result to error detecting means 34. The error detecting means 34 previously holds the correct output information of the printed circuit board 22 to be tested in accordance with a testing step in order to compare this information with an actual output of the printed circuit board 22 to be tested. If the correct output information and the actual output information are the same, then the guide panel 63 is to be grounded and the probe positioning means 301, 302, 303 positions the probe in accordance with the next positional information. In contrast, if they are not the same, the error detecting means 34 determines that an "error" occurs and the guide panel 63 is not grounded.

X and Y coordinates are input as the positional information of the via hole and/or the land of the printed circuit board 22 to be tested from the positional information inputting means 2 to the testing device 1. The positional information originally is stored in the testing server 3 and the testing server 3 send the positional information to positional information inputting means 2. The probe positioning means 301, 302, 303 positions the probe 4 in accordance with the positional information.

When probe tip pushing-out means 6 causes the probe tip to contact the predetermined via hole and/or land after the position of the probe 4 has been determined, it causes the top-like portion, disposed at the surface of the probe situated opposite to where the probe tip is projectable, to be grounded by the reaction pressure produced when the probe tip contacts the land and/or the via hole.

probe tip pushing-out means 6 is such as a motor of control a rod 64 which pushes out the probe tip 61. Positioning measuring means 31 is such as a circuit of measuring the position of the printed circuit board 22 or the device 20 and tilt controlling means 32 is such as a circuit of correcting the positional information. Printed circuit board output monitoring means 33 is such as a circuit of monitoring the output of the printed circuit board 22 and the error detecting means 34 is such as a circuit of detecting an error of he output of the printed circuit board 22.

Figure 4A:
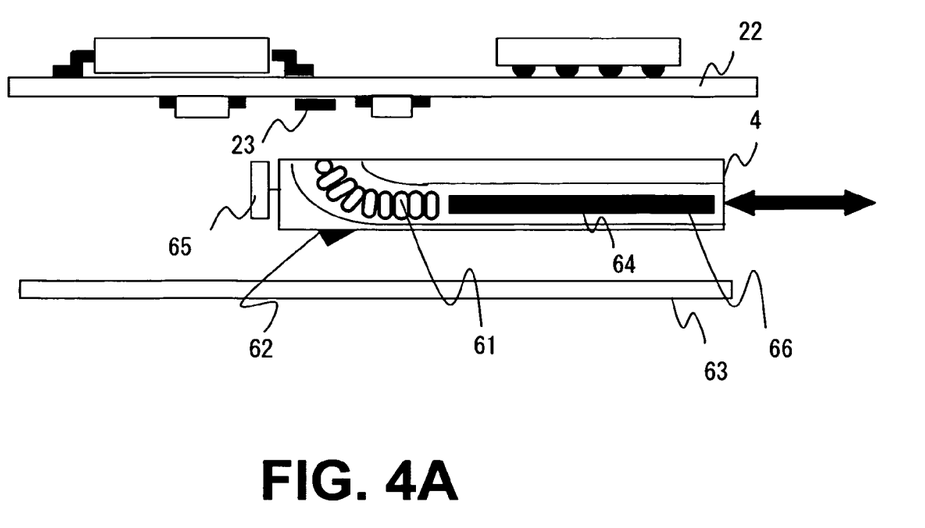
FIG. 4 shows in detail an example of a probe and an example of probe tip grounding means.

FIG. 4 shows in detail an embodiment of the probe 4 and an example of the probe tip 61, which are used in the testing device 1 according to the present invention. As shown in FIG. 4A showing a state prior to the pushing-out of the probe tip 61, a grounded guide panel 63 and the probe 4 are inserted in a gap between the printed circuit board 22 to be tested and the guide panel 63 adjacent thereto. Here, the adjacent printed circuit board (not shown) is usually disposed below the guide panel 63. The body of the probe 4 is formed of an insulating material, such as zirconia. The probe 4 is positioned so that the probe tip 61 is adjusted above or below a predetermined via hole and/or land 23. The guide panel 63 may be formed so as to be mountable to the printed circuit board 22. For example, the four corners of the printed circuit board 22 and the four corners of the guide panel 63 are secured with a gap having a size which allows testing by insertion of the probe 4 being formed therebetween, and the guide panel 63 is removed from the printed circuit board 22 after the testing.

Figure 4B:
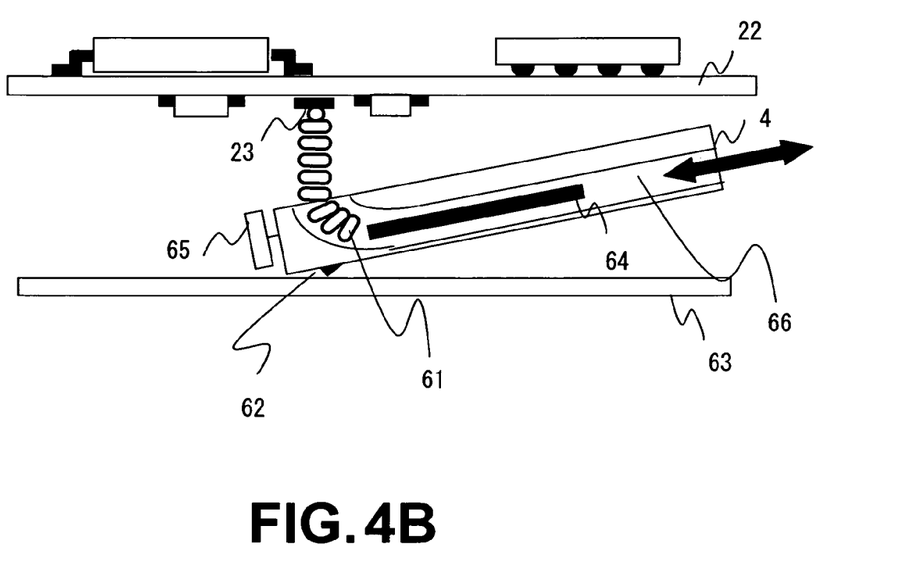

After completing the positioning, as shown in FIG. 4B showing a state after the pushing-out of the probe tip, the probe tip grounding means pushes the electrically conductive probe tip 61 incorporated in the probe 4 towards the via hole and/or the land 23 and causes the probe tip 61 to come into contact therewith. The probe tip 61 has a spring structure and is pushed out by a rod 64 and projects from the surface of the probe. The probe 4 has a storing unit 66, where the probe tip 61 and the rod 64 are disposed. The length of the probe tip 61 is longer than the sum of the size of a gap between the probe 4 and the printed circuit board 22 to be tested and the size of a gap between the probe 4 and the guide panel 63. The probe 4 is flexed by reaction with respect to the pushing out of the probe tip 61 towards the via hole and/or the land 23, so that a top-like portion 62, disposed at a back side of the probe and electrically connected to the probe tip 61, comes into contact with the guide panel 63 to thereby ground the probe tip 61.

The probe tip detects an actual output information from the via hole and/or the land 23 and transmit the actual output information to the error detecting means 34. If the correct output information and the actual output information are the same in the error detecting means 34, then the guide panel 63 is to be grounded. As a result, a simulated failure is caused by grounded the guide panel 63 because the probe tip 61 is electrically connected with top-like portion 62. On the other hand, if the correct output information and the actual output information are not the same in the error detecting means 34, guide panel 63 is not grounded and also probe tip 61 is not grounded. Since the probe tip 61 has a spring structure, the probe tip 61 can be easily incorporated in the probe 4 and can be smoothly pushed out from the probe 4. The operation of the rod 64 is controlled with the probe tip pushing-out means 6.

The testing device 1 further comprises probe tip overcurrent detecting means (refer to FIG. 3). When an overcurrent is detected when the probe tip 61 has been grounded, the grounding of the probe tip 61 is halted and an overcurrent error is output.

The testing device 1 further comprises probe tip open detecting means 36 (refer to FIG. 3). When an open is detected when the probe tip 61 has been grounded, an open error is output.

The probe positioning means 301, 302, 303 further comprises collision controlling means 37. When a collision is detected with a collision sensor 65 of the probe 4, the movement of the probe 4 is halted.

Figure 5:
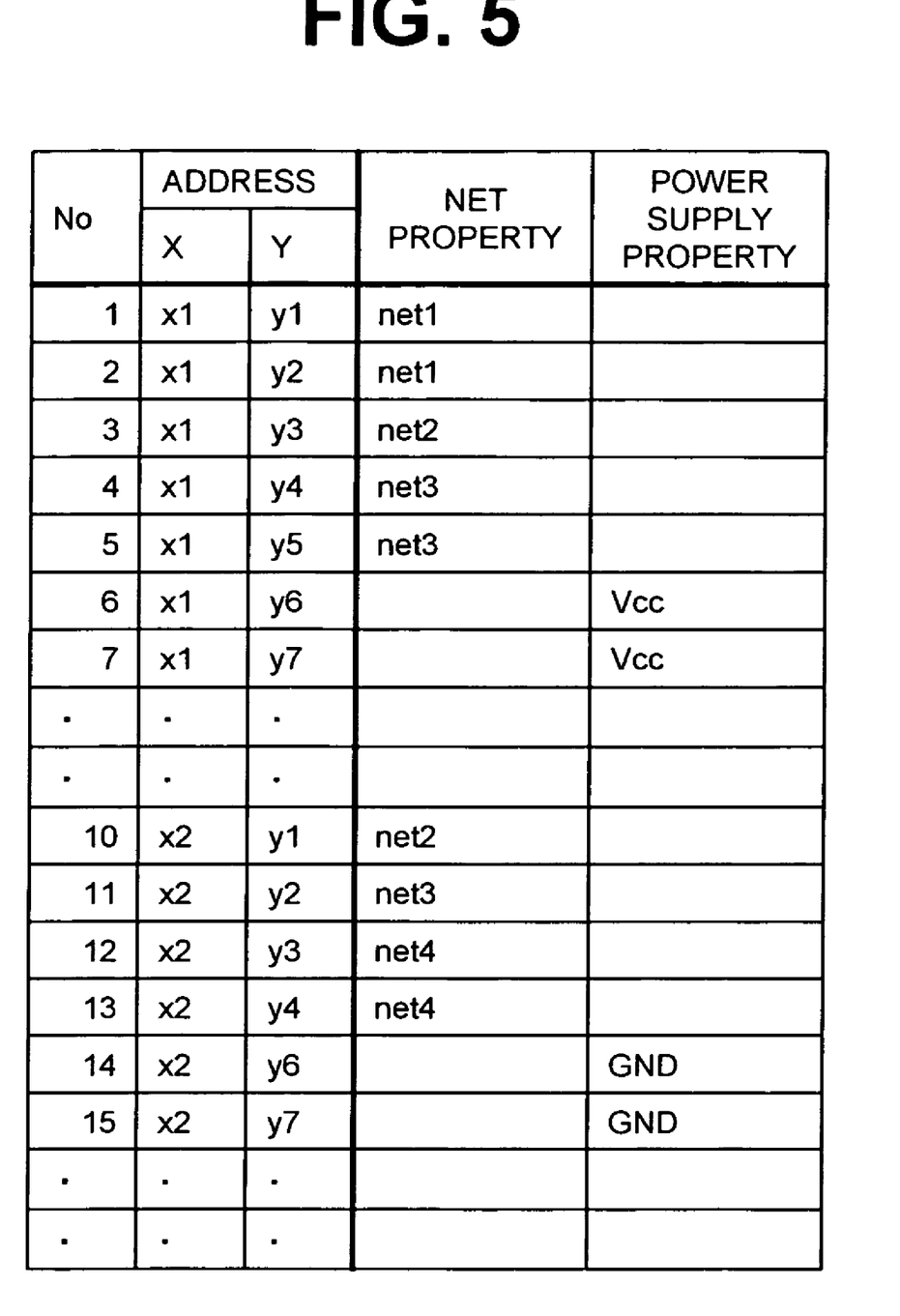
FIG. 5 shows an example of positional information including net properties and power supply properties.

FIG. 5 shows an example of a table in which power supply properties and via hole and/or land interconnection net properties are included in the positional information of a plurality of the via holes and/or lands 23 of the printed circuit board 22 to be tested, the positional information being input to the testing device 1 from the positional information inputting means 2.

The testing device 1 associates the positional information of the via hole and/or the land of the printed circuit board 22 with a net properties and power supply properties. A table, which shows the relation between the positional information and a net properties and power supply properties, is stored in the printed circuit board output monitoring means. The printed circuit board output monitoring means 33 send the table to the probe positioning means 301, 302, 303.

In this case, the probe positioning means 301, 302, 303 determines that, for the first positional information and the second positional information having the same net, such as "net 1," positioning is only performed for the first positional information, so that positioning for the second positional information is omitted and is not tested. For the sixth positional information, the seventh positional information, the fourteenth positional information, and the fifteenth positional information having power supply properties, positioning operations are omitted and is not tested.

What is claimed is:

1. A printed circuit board testing device to test an object in a printed circuit board to be tested, comprising:
   a probe for performing an object to be tested;
   inputting unit inputting positional information of the testing object; and
   positioning unit determining the position of the probe in accordance with the positional information,
   wherein, when a probe tip of the probe is projected and comes into contact with an object to be tested, a protrusion at the probe is grounded by a reaction pressure that is generated when the probe tip contacts the testing object.

2. The printed circuit board testing device according to claim 1, wherein an electrically conductive guide panel is provided with respect to a surface of the probe where the protrusion is provided, and the protrusion is grounded to the guide panel by the reaction pressure that is generated when the probe tip contacts the testing object.

3. The printed circuit board testing device according to claim 1, wherein the probe tip of the probe has a spring structure and is incorporated in the probe so as to project from a surface of the probe.

4. The printed circuit board testing device according to claim 1, wherein the probe is disposed in a gap between the printed circuit board to be tested and a printed circuit board adjacent thereto.

5. A printed circuit board testing method to test an object in a printed circuit board to be tested, comprising:
   inputting positional information of an object to be tested;

positioning a probe for determining the position of the probe in accordance with the positional information, the probe performing the test on the testing object;

projecting a probe tip of the probe; and grounding a protrusion at the probe by a reaction pressure that is generated when the probe tip that has been projected in the probe tip projecting step contacts the testing object.

6. The printed circuit board testing method according to claim 5, wherein an electrically conductive guide panel is disposed with respect to a surface of the probe where the protrusion is disposed, and the grounding comprises grounding the protrusion to the guide panel by the reaction pressure that is generated when the probe tip contacts the testing object.

7. The printed circuit board testing method according to claim 5, wherein the probe tip projecting comprises projecting from a surface of the probe the probe tip which has a spring structure and which is incorporated in the probe.

8. The printed circuit board testing method according to claim 5, wherein the positioning step-comprises determining the position of the probe by inserting the probe into a gap between the printed circuit board to be tested and a printed circuit board adjacent thereto.

* * * * *

UNITED STATES PATENT AND TRADEMARK OFFICE
CERTIFICATE OF CORRECTION

PATENT NO. : 7,339,386 B2
APPLICATION NO. : 11/289452
DATED : March 4, 2008
INVENTOR(S) : Susumu Miyazawa et al.

Page 1 of 1

It is certified that error appears in the above-identified patent and that said Letters Patent is hereby corrected as shown below:

Column 8, Line 7, after "positioning" delete "step-".

Signed and Sealed this

Twenty-ninth Day of July, 2008

JON W. DUDAS
*Director of the United States Patent and Trademark Office*